(12) United States Patent
Gates et al.

(10) Patent No.: US 7,030,468 B2
(45) Date of Patent: Apr. 18, 2006

(54) LOW K AND ULTRA LOW K SICOH DIELECTRIC FILMS AND METHODS TO FORM THE SAME

(75) Inventors: Stephen M. Gates, Ossining, NY (US); Christos D. Dimitrakopoulos, Somers, NY (US); Alfred Grill, White Plains, NY (US); Son Van Nguyen, Yorktown Heights, NY (US)

(73) Assignee: International Business Machines Corporation, Armonk, NY (US)

( * ) Notice: Subject to any disclaimer, the term of this patent is extended or adjusted under 35 U.S.C. 154(b) by 59 days.

(21) Appl. No.: 10/758,724

(22) Filed: Jan. 16, 2004

(65) Prior Publication Data
US 2005/0156285 A1    Jul. 21, 2005

(51) Int. Cl.
*H01L 23/58* (2006.01)

(52) U.S. Cl. .................. 257/632; 257/633; 257/634; 257/635; 257/636; 257/645; 257/646; 257/644; 174/138 R

(58) Field of Classification Search ................ 287/632, 287/633, 634, 635, 636, 641, 642, 647, 664, 287/665, 667; 174/138 R; 438/627, 727, 438/734
See application file for complete search history.

(56) References Cited

U.S. PATENT DOCUMENTS 6,472,306 B1 * 10/2002 Lee et al. .................... 438/623
2004/0089470 A1 * 5/2004 Shimoto et al. ............ 174/250

* cited by examiner

*Primary Examiner*—Evan Pert
*Assistant Examiner*—Fazli Erdem

(57) ABSTRACT

Dielectric materials including elements of Si, C, O and H having specific values of mechanical properties (tensile stress, elastic modulus, hardness cohesive strength, crack velocity in water) that result in a stable ultra low k film which is not degraded by water vapor or integration processing are provided. The dielectric materials have a dielectric constant of about 2.8 or less, a tensile stress of less than 45 MPa, an elastic modulus from about 2 to about 15 GPa, and a hardness from about 0.2 to about 2 GPa. Electronic structures including the dielectric materials of the present invention as well as various methods of fabricating the dielectric materials are also provided.

45 Claims, 7 Drawing Sheets

LOW K AND ULTRA LOW K SICOH DIELECTRIC FILMS AND METHODS TO FORM THE SAME

RELATED APPLICATIONS

The present application is related to co-assigned U.S. Pat. Nos. 6,147,009, 6,312,793, 6,441,491, 6,437,443, 6,441,491, 6,541,398, 6,479,110 B2, and 6,497,963, the contents of which are incorporated herein by reference. The present application is also related to co-pending and co-assigned U.S. patent application Ser. No. 10/174,749, filed Jun. 19, 2002, Ser. No. 10/340,000, filed Jan. 23, 2003 and Ser. No. 10/390,801, filed Mar. 18, 2003, the entire contents of each of the aforementioned U.S. Patent Applications are also incorporated herein by reference.

FIELD OF THE INVENTION

The present invention generally relates to a class of dielectric materials comprising Si, C, O and H atoms (SiCOH), also called C doped oxide (CDO) or organosilicate glass (OSG), that have a low dielectric constant (k), and methods for fabricating films of these materials and electronic devices containing such films. More particularly, the present invention relates to the use of such dielectric materials as an intralevel or interlevel dielectric film, a dielectric cap or a hard mask/polish stop in an ultra large scale integrated (ULSI) back-end-of-the-line (BEOL) wiring structure, electronic structures containing the films and methods for fabrication of such films and structures.

BACKGROUND OF THE INVENTION

The continuous shrinking in dimensions of electronic devices utilized in ULSI circuits in recent years has resulted in increasing the resistance of the BEOL metallization as well as increasing the capacitance of the intralayer and interlayer dielectric. This combined effect increases signal delays in ULSI electronic devices. In order to improve the switching performance of future ULSI circuits, low dielectric constant (k) insulators and particularly those with k significantly lower than silicon oxide are needed to reduce the capacitances. Dielectric materials (i.e., dielectrics) that have low k values have been commercially available. For instance, one such material is polytetrafluoroethylene ("PTFE"), which has a k value of 2.0. However, these dielectric materials are not thermally stable when exposed to temperatures above 300~350° C. Integration of these dielectrics in ULSI chips requires a thermal stability of at least 400° C. Consequently, these dielectrics are rendered useless during integration.

The low k materials that have been considered for applications in ULSI devices include polymers containing elements of Si, C, O and H, such as methylsiloxane, methylsilsesquioxanes, and other organic and inorganic polymers. For instance, a paper (N. Hacker et al. "Properties of new low dielectric constant spin-on silicon oxide based dielectrics" *Mat. Res. Soc. Symp. Proc.* 476 (1997): 25) describes materials that appear to satisfy the thermal stability requirement, even though some of these materials propagate cracks easily when reaching thicknesses needed for integration in the interconnect structure when films are prepared by a spin-on technique. Furthermore, the precursor materials are high cost and prohibitive for use in mass production. In contrast to this, most of the fabrication steps of very-large-scale-integration ("VLSI") and ULSI chips are carried out by plasma enhanced chemical or physical vapor deposition techniques. The ability to fabricate a low k material by a plasma enhanced chemical vapor deposition ("PECVD") technique using readily available processing equipment will simplify the material's integration in the manufacturing process, reduce manufacturing cost, and create less hazardous waste.

The ability to fabricate a low k material by a plasma enhanced chemical vapor deposition (PECVD) technique using previously installed and available processing equipment will thus simplify its integration in the manufacturing process, reduce manufacturing cost, and create less hazardous waste. U.S. Pat. Nos. 6,147,009 and 6,497,963 assigned to the common assignee of the present invention, which are incorporated herein by reference in their entirety, describe a low dielectric constant material consisting of elements of Si, C, O and H atoms having a dielectric constant not more than 3.6 and which exhibits very low crack propagation velocities.

U.S. Pat. Nos. 6,312,793, 6,441,491 and 6,479,110 B2, assigned to the common assignee of the present invention and incorporated herein by reference in their entirety, describe a multiphase low k dielectric material that consists of a matrix composed of elements of Si, C, O and H atoms, a phase composed mainly of C and H and having a dielectric constant of not more than 3.2.

Ultra low k films having a dielectric constant of less than 2.7 (and preferably less than 2.3) are also known in the art. A major problem with prior art ultra low k films is that when integrating such films in ULSI devices, the integrated films exhibit poor mechanical properties (tensile stress, elastic modulus, hardness, cohesive strength, and crack velocity in water).

In view of the above drawbacks with prior art low and ultra low k films, there exists a need for developing a class of stable SiCOH dielectrics having a dielectric constant value of about 2.8 or less with specific mechanical properties that allow for such dielectric films to be used in ULSI devices.

SUMMARY OF THE INVENTION

Among the broad class of SiCOH materials, the applicants have determined specific values of mechanical properties (tensile stress, elastic modulus, hardness, cohesive strength, and crack velocity in water) that result in a stable dielectric film, which is not degraded by water vapor or integration processing, and results in a completed integrated circuit chip that survives the mechanical and thermal stress of dicing and packaging. In contrast, other undesirable values of the same mechanical properties result in unstable SiCOH films that are degraded by environmental humidity and integration processing. Still other undesirable mechanical properties result in a chip that forms cracks during dicing and packaging. Additionally, the applicants of the present application have identified other film properties (hydrophobicity, and pore size) that are also required to make a successful, reliable, semiconductor integrated circuit (IC) device using the SiCOH dielectric of the present application as a BEOL interconnect dielectric.

One object of the present invention is to provide a low or ultra low k dielectric constant material comprising elements of Si, C, O and H (hereinafter "SiCOH") having a dielectric constant of not more than 2.8, and having a combination of specific desirable mechanical properties.

It is yet another object of the present invention to provide a SiCOH dielectric material having a covalently bonded tri-dimensional network structure, which comprises the following covalent bonds Si—O, Si—C, Si—H, C—H and C—C bonds.

It is another object of the present invention to provide a SiCOH dielectric material having a dielectric constant of not more than 2.8, which is very stable towards H₂O vapor (humidity) exposure, including a resistance to crack formation in water.

It is still another object of the present invention to provide an electronic structure incorporating the inventive stable SiCOH material as an intralevel or interlevel dielectric in a BEOL wiring structure.

It is another object of the present invention to provide methods for fabricating a SiCOH dielectric material with the inventive combination of mechanical properties and stability.

In broad terms, the present invention provides a stable low or ultra low k dielectric material comprising elements of Si, C, O, H that has a dielectric constant of about 2.8 or less, a tensile stress of less than 45 MPa, an elastic modulus from about 2 to about 15 GPa, and a hardness from about 0.2 to about 2 GPa. The stable low or ultra low k dielectric material of the present invention is further characterized as having a cohesive strength from about 1.7 to about 4.5 $J/m^2$, and a crack development velocity in water of not more than $1 \times 10^{-10}$ m/sec for a film thickness from about 1.1 to about 2.8 microns.

In a first embodiment of the present invention, a stable ultra low k SiCOH dielectric material that has a dielectric constant of 2.7, a tensile stress of less than 45 MPa, an elastic modulus from about 9 to about 15 GPa, and a hardness from about 0.5 to about 2 GPa is provided. Moreover, the SiCOH dielectric material of the first embodiment of the present invention has a cohesive strength from about 4.0 to about 4.5 $J/m^2$, and a crack development velocity in water of not more than $1 \times 10^{-10}$ m/sec for a film thickness of 2.8 microns.

In a second embodiment of the present invention, a stable ultra low k SiCOH dielectric material that has a dielectric constant of 2.6, a tensile stress of less than 45 MPa, an elastic modulus from about 8 to about 13 GPa, and a hardness from about 0.4 to about 1.9 GPa is provided. The SiCOH dielectric material of the second embodiment of the present also has a cohesive strength from about 4.0 to about 4.5 $J/m^2$, and a crack development velocity in water of not more than $1 \times 10^{-10}$ m/sec for a film thickness of 2.7 microns.

In a third embodiment of the present invention, a stable ultra low k SiCOH dielectric material that has a dielectric constant of 2.5, a tensile stress of less than 45 MPa, an elastic modulus from about 7 to about 12 GPa, and a hardness from about 0.35 to about 1.8 GPa is provided. The dielectric material of the third embodiment of the present invention can be further characterized as having a cohesive strength from about 2.5 to about 3.9 $J/m^2$, and a crack development velocity in water of not more than $1 \times 10^{-10}$ m/sec for a film thickness of 2.5 microns.

In a fourth embodiment of the present invention, a stable ultra low k SiCOH dielectric material that has a dielectric constant of 2.4, a tensile stress of less than 40 MPa, an elastic modulus from about 6 to about 11 GPa, and a hardness from about 0.3 to about 1.7 GPa is provided. A cohesive strength from about 2.4 to about 3.8 $J/m^2$, and a crack development velocity in water of not more than $1 \times 10{-10}$ m/sec for a film thickness of 2.3 microns is provided by the dielectric material of the fourth embodiment of the present invention.

In a fifth embodiment of the present invention, a stable ultra low k SiCOH dielectric material that has a dielectric constant of 2.3, a tensile stress of less than 40 MPa, an elastic modulus from about 5 to about 10 GPa, and a hardness from about 0.25 to about 1.6 GPa is provided. Dielectric material within the fifth embodiment of the present invention has a cohesive strength from about 2.2 to about 3.7 $J/m^2$, and a crack development velocity in water of not more than $1 \times 10{-10}$ m/sec for a film thickness of 1.9 microns is provided.

In a sixth embodiment of the present invention, a stable ultra low k SiCOH dielectric material that has a dielectric constant of 2.2, a tensile stress of less than 40 MPa, an elastic modulus from about 4 to about 9 GPa, and a hardness from about 0.2 to about 1.5 GPa is provided. The SiCOH dielectric material of the sixth embodiment has a cohesive strength from about 2.0 to about 3.5 $J/m^2$, and a crack development velocity in water of not more than $1 \times 10{-10}$ m/sec for a film thickness of 1.5 microns.

In a seventh embodiment of the present invention, a stable ultra low k SiCOH dielectric material that has a dielectric constant of 2.1, a tensile stress from about 20 to about 35 MPa, an elastic modulus from about 3 to about 8 GPa, and a hardness from about 0.2 to about 1.4 GPa is provided. In this embodiment of the present invention, the SiCOH dielectric material has a cohesive strength from about 1.8 to about 3.4 $J/m^2$, and a crack development velocity in water of not more than $1 \times 10{-10}$ m/sec for a film thickness of 1.3 microns.

In an eighth embodiment of the present invention, a stable ultra low k SiCOH dielectric material that has a dielectric constant of 2.0, a tensile stress from about 20 to about 35 MPa, an elastic modulus from about 2 to about 7 GPa, and a hardness of 0.2 GPa is provided. A cohesive strength from about 1.7 to about 3.3 $J/m^2$, and a crack development velocity in water of not more than $1 \times 10^{-10}$ m/sec for a film thickness of 1.1 microns is observed with the SiCOH dielectric material of the eighth embodiment of the present invention.

In addition to the aforementioned properties, the SiCOH dielectric materials of the present invention are hydrophobic with a water contact angle of greater than 70°, more preferably greater than 80°.

The present invention also relates to electronic structures which include at least one stable low or ultra low k dielectric material comprising elements of Si, C, O, H that has a dielectric constant of about 2.8 or less, a tensile stress of less than 45 MPa, an elastic modulus from about 2 to about 15 GPa, and a hardness from about 0.2 to about 2 GPa, as a dielectric of an interconnect structure.

The dielectric material of the present invention may be used as the interlevel or intralevel dielectric, a capping layer, and/or as a hard mask/polish-stop layer in electronic structures.

Specifically, the electronic structure of the present invention includes a pre-processed semiconducting substrate that has a first region of metal embedded in a first layer of insulating material, a first region of conductor embedded in a second layer of insulating material, the second layer of insulating material being in intimate contact with the first layer of insulating material, the first region of conductor being in electrical communication with the first region of metal, and a second region of conductor being in electrical communication with the first region of conductor and being embedded in a third layer of insulating material, the third layer of insulating material being in intimate contact with the second layer of insulating material.

In the above structure, each of the insulating layers can comprise the inventive low or ultra low k SiCOH dielectric material of the present invention.

The electronic structure may further include a dielectric cap layer situated in-between the first layer of insulating material and the second layer of insulating material, and may further include a dielectric cap layer situated in-between the second layer of insulating material and the third layer of insulating material. The electronic structure may further include a first dielectric cap layer between the second layer of insulating material and the third layer of insulating material, and a second dielectric cap layer on top of the third layer of insulating material.

The dielectric cap material can be selected from silicon oxide, silicon nitride, silicon oxynitride, silicon carbon nitride (SiCN), refractory metal silicon nitride with the refractory metal being Ta, Zr, Hf or W, silicon carbide, silicon carbo-oxide, carbon doped oxides and their hydrogenated or nitrided compounds. In some embodiments, the dielectric cap itself can comprise the inventive low or ultra low k SiCOH dielectric material. The first and the second dielectric cap layers may be selected from the same group of dielectric materials. The first layer of insulating material may be silicon oxide or silicon nitride or doped varieties of these materials, such as PSG or BPSG.

The electronic structure may further include a diffusion barrier layer of a dielectric material deposited on at least one of the second and third layer of insulating material. The electronic structure may further include a dielectric layer on top of the second layer of insulating material for use as a RIE hard mask/polish-stop layer and a dielectric diffusion barrier layer on top of the dielectric RIE hard mask/polish-stop layer. The electronic structure may further include a first dielectric RIE hard mask/polish-stop layer on top of the second layer of insulating material, a first dielectric RIE diffusion barrier layer on top of the first dielectric polish-stop layer a second dielectric RIE hard mask/polish-stop layer on top of the third layer of insulating material, and a second dielectric diffusion barrier layer on top of the second dielectric polish-stop layer. The dielectric RIE hard mask/polish-stop layer may be comprised of the inventive SiCOH dielectric material as well.

The present invention also relates to various methods of fabricating a stable low or ultra low k dielectric material comprising elements of Si, C, O, H that has a dielectric constant of about 2.8 or less, a tensile stress of less than 45 MPa, an elastic modulus from about 2 to about 15 GPa, and a hardness from about 0.2 to about 2 GPa.

DETAILED DESCRIPTION OF THE INVENTION

Figure 1A:
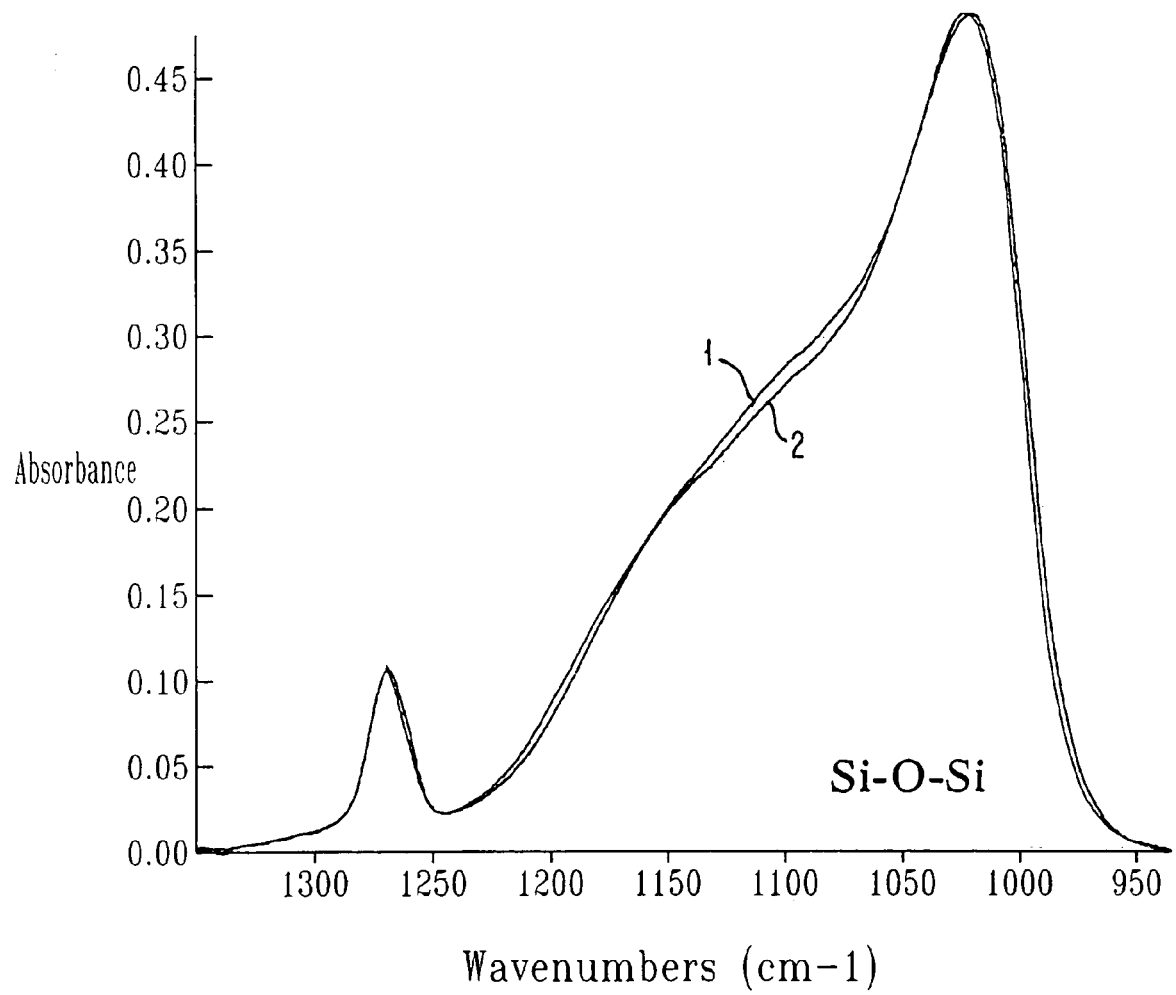
FIGS. 1A–1B are the Si—O stretching regions of the FTIR spectra of a stable low k SiCOH dielectric material of the present invention that has a dielectric constant of 2.8, a tensile stress of less than 40 MPa, an elastic modulus from about 9 to about 15 GPa, and a hardness from about 0.5 to about 2 GPa.

As stated above, the present invention provides a new class of dielectric materials (porous or non-porous) that comprises a matrix of a hydrogenated oxidized silicon carbon material (SiCOH) comprising elements of Si, C, O and H in a covalently bonded tri-dimensional network and have a dielectric constant of about 2.8 or less. The term "tri-dimensional network" is used throughout the present application to denote a SiCOH dielectric material which includes silicon, carbon, oxygen and hydrogen that are interconnected and interrelated in the x, y, and z directions. It is noted that the inventive dielectric material is not polymeric, but instead it comprises a random tri-dimensional (i.e., three dimensional) structure comprising a covalently bonded network. The covalently bonded network can comprise Si—O, Si—C, Si—H, C—H or C—C bonds.

The SiCOH dielectric material of the present invention comprises between about 5 and about 40, more preferably from about 10 to about 20, atomic percent of Si; between about 5 and about 45, more preferably from about 10 to about 30, atomic percent of C; between 0 and about 50, more preferably from about 10 to about 35, atomic percent of O; and between about 10 and about 55, more preferably from about 20 to about 45, atomic percent of H.

In some embodiments, the SiCOH dielectric material of the present invention may further comprise F and N. In yet another embodiment of the present invention, the SiCOH dielectric material may optionally have the Si atoms partially substituted by Ge atoms. The amount of these optional elements that may be present in the inventive dielectric material of the present invention is dependent on the amount of precursor that contains the optional elements that is used during deposition.

The SiCOH dielectric material of the present invention preferably contains molecular scale voids (i.e., nanometer-sized pores) of between about 0.3 to about 50 nanometers in diameter, and most preferably between about 0.4 and about 5 nanometers in diameter, which further reduce the dielectric constant of the SiCOH dielectric material. The nanometer-sized pores occupy a volume of between about 0.5% and about 50% of a volume of the material.

The SiCOH dielectric material of the present invention is a dielectric material comprising elements of at least Si, C, O, H that have a specific set of characteristics (tensile stress, elastic modulus, hardness, cohesive strength, and crack velocity in water) that result in a stable low or ultra low k film which is not degraded by water vapor or integration processing. In particular, the SiCOH dielectric material of the present invention is thermally stable to a temperature of at least 350° C.

In a broad sense, the inventive SiCOH dielectric material has a dielectric constant of about 2.8 or less, a tensile stress of less than 45 Mpa or a compressive stress, an elastic modulus from about 2 to about 15 GPa, and a hardness from about 0.2 to about 2 GPa. The inventive dielectric material can also be characterized as having a cohesive strength from about 1.7 to about 4.5 J/m$^2$, and a crack development velocity in water of not more than $1 \times 10^{-10}$ m/sec for a film thickness from about 1.1 to about 2.8 microns.

In the present invention, the stress is measured by measurements of the curvature of an entire Si wafer (using a Flexus tool, or other tools known in the art) or the curvature of a small strip of Si using capacitance measurements to observe deflection of the Si strip. As is known in the art, conventional tensile stress has a positive sign (>0), while compressive stress has a negative sign, so that compressive (<0) is included when a tensile stress less than 45 MPa is specified. It is thus noted that the phrase "a tensile stress of less than 45 MPa" also includes compressive stress. The elastic modulus and hardness are measured by nanoindentation as is known in the art. The cohesive strength is measured by using a 4 point bend apparatus and published literature procedures described in M. W. Lane, "Interface Fracture", Annu. Rev. Mater. Res. 2003, 33, pp. 29–54. The crack velocity is determined by the method described by R. F. Cook and E. G. Liniger, Mat. Res. Soc. Symp. Proc. Vol. 511, 1998, 171 and R. F. Cook and E. G. Liniger, E.C.S. Proc. Vol. 98-3, 1998, 129.

Figure 2A:
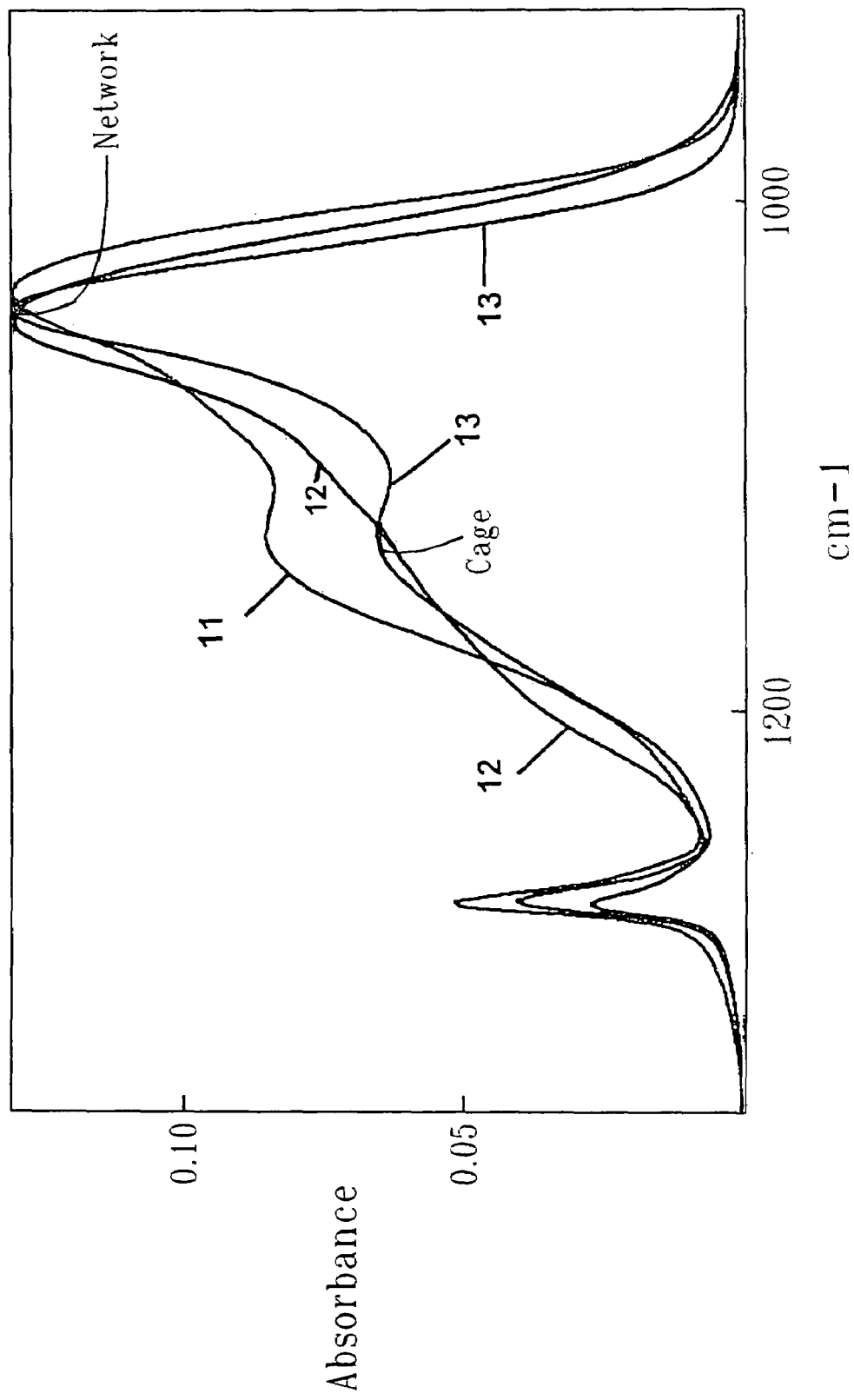
FIG. 2A is the Si—O stretching region of the FTIR spectrum of a stable ultra low k SiCOH dielectric material of the present invention according to the $3^{rd}$ implementation example.
Figure 2B:
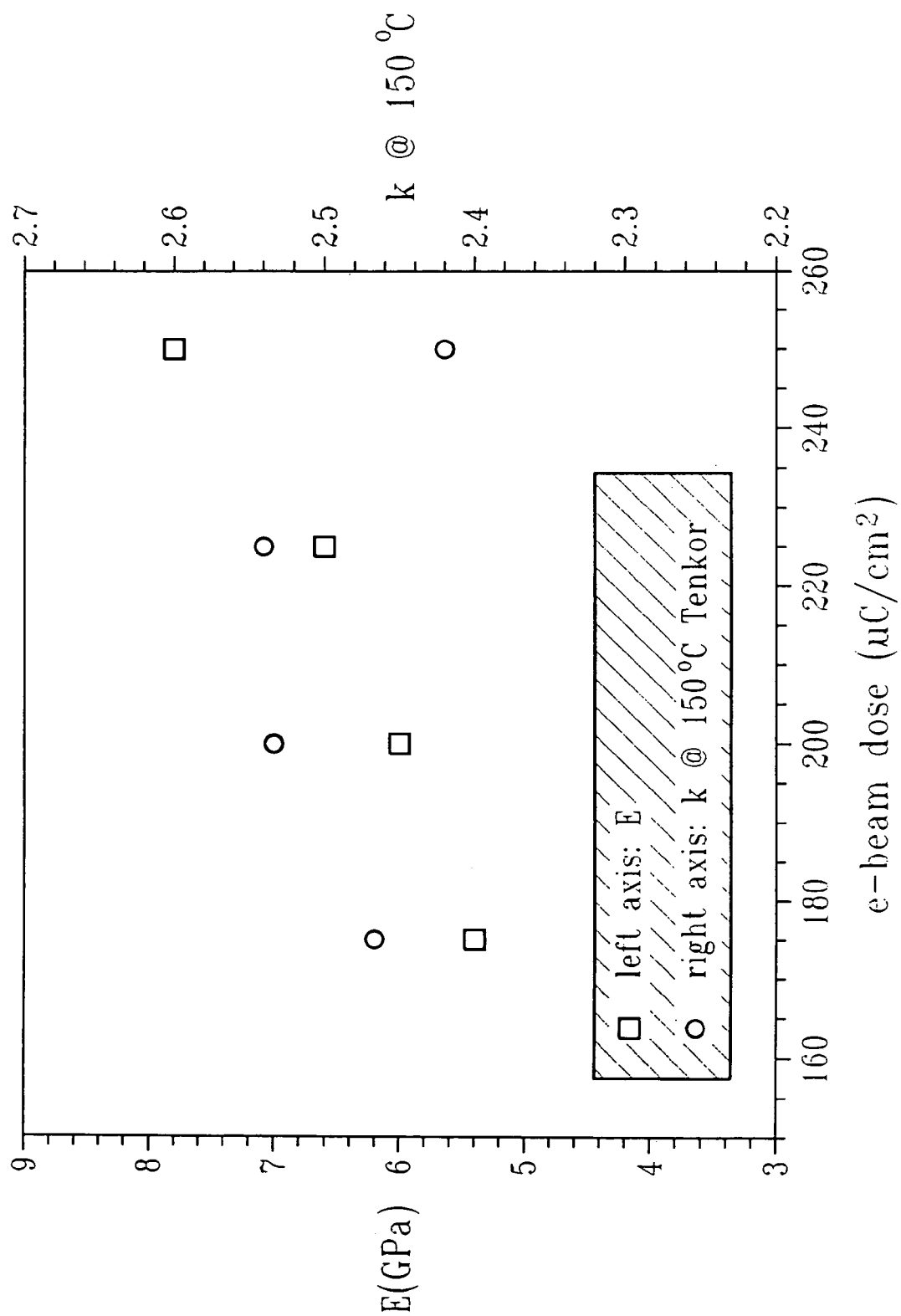
FIG. 2B is the elastic modulus of the same material plotted vs. e-beam dose.
Figure 3:
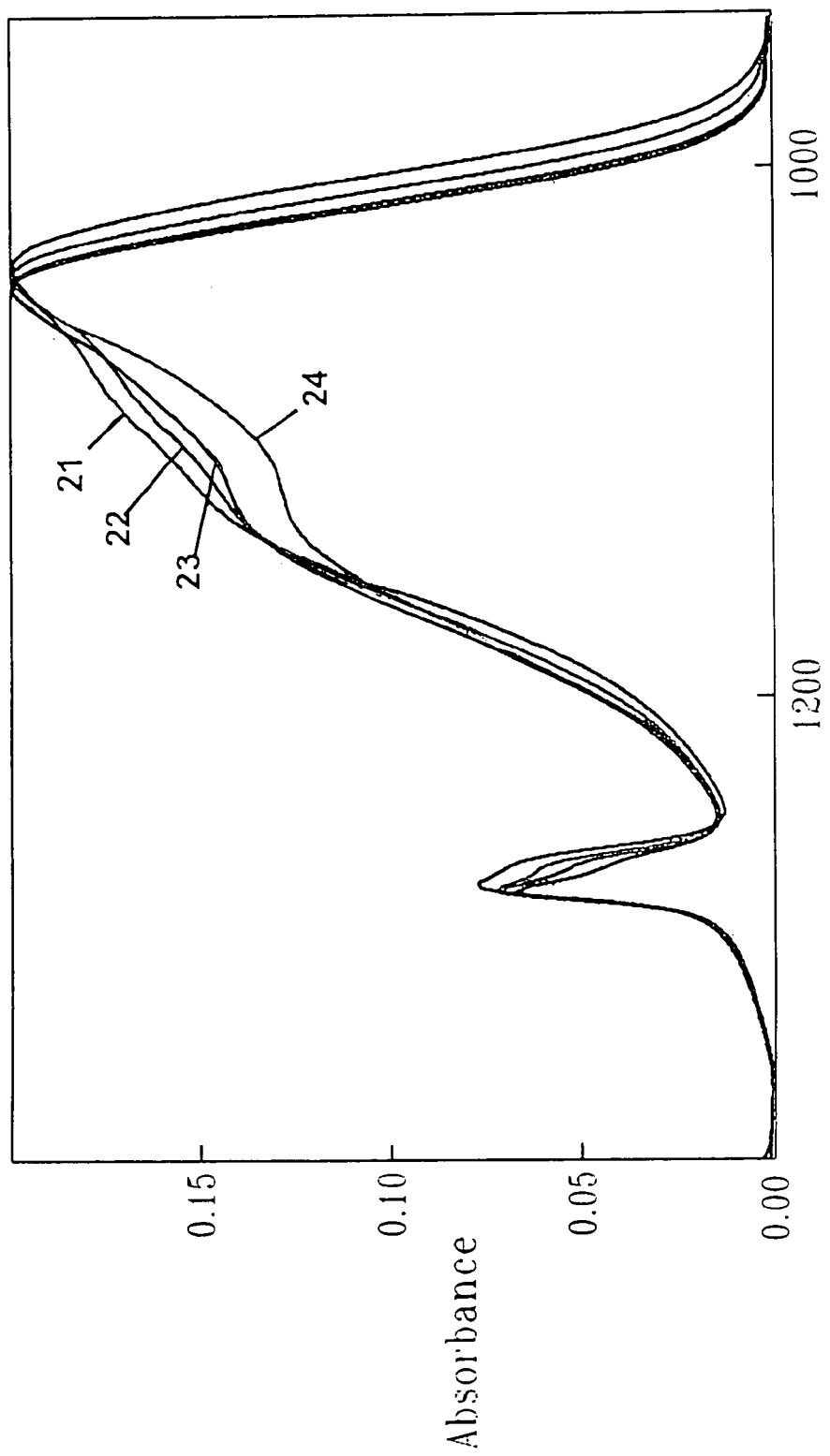
FIG. 3 is the Si—O stretching region of the FTIR spectrum of a stable ultra low k SiCOH dielectric material of the present invention according to the $3^{rd}$ implementation example showing the effects to the FTIR spectrum using different UV treatment times.

The inventive SiCOH dielectric material is further characterized as having a FTIR spectrum such as shown in FIGS. 1–3 (a detailed explanation of the FTIR spectra shown in FIGS. 1–3 will be provided hereinbelow). In the present invention, the covalently bonded tri-dimensional network structure of the inventive SiCOH dielectric materials have Si—O bonds that can produce an FTIR absorbance spectrum in which the ratio of the cage Si—O peak intensity to the network Si—O peak intensity is decreased using a treatment after deposition, where "decreased" means relative to the other SiCOH materials (e.g., thermally cured SiCOH).

In a first embodiment of the present invention, a stable ultra low k SiCOH dielectric material that has a dielectric constant of 2.7, a tensile stress of less than 45 MPa, an elastic modulus from about 9 to about 15 GPa, and a hardness from about 0.5 to about 2 GPa is provided. These SiCOH dielectrics of the first embodiment of the present invention have a cohesive strength from about 4.0 to about 4.5 J/m$^2$, and a crack development velocity in water of not more than $1 \times 10^{-10}$ m/sec for a film thickness of 2.8 microns is provided.

In a second embodiment of the present invention, a stable ultra low k SiCOH dielectric material that has a dielectric constant of 2.6, a tensile stress of less than 45 MPa, an elastic modulus from about 8 to about 13 GPa, and a hardness from about 0.4 to about 1.9 GPa is provided. In this embodiment, a cohesive strength from about 4.0 to about 4.5 J/m$^2$, and a crack development velocity in water of not more than $1 \times 10^{-10}$ m/sec for a film thickness of 2.7 microns is provided.

In a third embodiment of the present invention, a stable ultra low k SiCOH dielectric material that has a dielectric constant of 2.5, a tensile stress of less than 45 MPa, an elastic modulus from about 7 to about 12 GPa, and a hardness from about 0.35 to about 1.8 GPa is provided. The dielectric material of the third embodiment has a cohesive strength from about 2.5 to about 3.9 J/m$^2$, and a crack development velocity in water of not more than $1 \times 10^{-10}$ m/sec for a film thickness of 2.5 microns is provided.

In a fourth embodiment of the present invention, a stable ultra low k SiCOH dielectric material that has a dielectric constant of 2.4, a tensile stress of less than 40 MPa, an elastic modulus from about 6 to about 11 GPa, and a hardness from about 0.3 to about 1.7 GPa is provided. A cohesive strength from about 2.4 to about 3.8 J/m$^2$, and a crack development velocity in water of not more than $1 \times 10^{-10}$ m/sec for a film thickness of 2.3 microns is provided using the SiCOH of this embodiment of the present invention.

In a fifth embodiment of the present invention, a stable ultra low k SiCOH dielectric material that has a dielectric constant of 2.3, a tensile stress of less than 40 MPa, an elastic modulus from about 5 to about 10 GPa, a hardness from about 0.25 to about 1.6 GPa is provided. The dielectric material of this embodiment has a cohesive strength from about 2.2 to about 3.7 J/m$^2$, and a crack development velocity in water of not more than $1 \times 10^{-10}$ m/sec for a film thickness of 1.9 microns is provided.

In a sixth embodiment of the present invention, a stable ultra low k SiCOH dielectric material that has a dielectric constant of 2.2, a tensile stress of less than 40 MPa, an elastic modulus from about 4 to about 9 GPa, and a hardness from about 0.2 to about 1.5 GPa is provided. The dielectric material of this embodiment has a cohesive strength from about 2.0 to about 3.5 J/m$^2$, and a crack development velocity in water of not more than $1 \times 10^{-10}$ m/sec for a film thickness of 1.5 microns is provided.

In a seventh embodiment of the present invention, a stable ultra low k SiCOH dielectric material that has a dielectric constant of 2.1, a tensile stress from about 20 to about 35 MPa, an elastic modulus from about 3 to about 8 GPa, and a hardness from about 0.2 to about 1.4 GPa is provided. Such films having the aforementioned properties provide a cohesive strength from about 1.8 to about 3.4 J/m$^2$, and a crack development velocity in water of not more than $1 \times 10^{-10}$ m/sec for a film thickness of 1.3 microns.

In an eighth embodiment of the present invention, a stable ultra low k SiCOH dielectric material that has a dielectric constant of 2.0, a tensile stress from about 20 to about 35 MPa, an elastic modulus from about 2 to about 7 GPa, and a hardness of 0.2 GPa is provided. For this embodiment of the invention, a cohesive strength from about 1.7 to about 3.3 J/m$^2$, and a crack development velocity in water of not more than 1×10–10 m/sec for a film thickness of 1.1 microns is provided.

Table 1 that follows provides a list of each of the various embodiments of the present invention:

TABLE 1

| k of the SiCOH | Stress, MPa | Modulus, GPa | Hardness, GPa | Maximum Film Thickness, in microns, for crack velocity in $H_2O < 1 \times 10^{-10}$ m/sec | Cohesive Strength, J/m$^2$ |
|---|---|---|---|---|---|
| 2.7 | <45 | 9–15 | 0.5–2 | 2.8 | 4.0–4.5 |
| 2.6 | <45 | 8–13 | 0.4–1.9 | 2.7 | 4.0–4.5 |
| 2.5 | <45 | 7–12 | 0.35–1.8 | 2.5 | 2.5–3.9 |
| 2.4 | <40 | 6–11 | 0.3–1.7 | 2.3 | 2.4–3.8 |

TABLE 1-continued

| k of the SiCOH | Stress, MPa | Modulus, GPa | Hardness, GPa | Maximum Film Thickness, in microns, for crack velocity in $H_2O < 1 \times 10^{-10}$ m/sec | Cohesive Strength, $J/m^2$ |
|---|---|---|---|---|---|
| 2.3 | <40 | 5–10 | 0.25–1.6 | 1.9 | 2.2–3.7 |
| 2.2 | <40 | 4–9 | 0.2–1.5 | 1.5 | 2.0–3.5 |
| 2.1 | 20–35 | 3–8 | 0.2–1.4 | 1.3 | 1.8–3.4 |
| 2.0 | 20–35 | 2–7 | 0.2 | 1.1 | 1.7–3.3 |

In addition to the aforementioned properties, the SiCOH dielectric materials of the present invention are hydrophobic with a water contact angle of greater than 70°, more preferably greater than 80°.

The inventive stable SiCOH dielectric materials are typically deposited using plasma enhanced chemical vapor deposition (PECVD). In addition to PECVD, the present invention also contemplates that the stable SiCOH dielectric materials can be formed utilizing chemical vapor deposition (CVD), high-density plasma (HDP), pulsed PECVD, spin-on application, or other related methods.

In the deposition process, the SiCOH dielectric material is formed by providing at least a first precursor (liquid, gas or vapor) comprising atoms of Si, C, O, and H, and an inert carrier such as He or Ar, into a reactor, preferably the reactor is a PECVD reactor, and then depositing a film derived from said first precursor onto a suitable substrate utilizing conditions that are effective in forming the SiCOH dielectric material of the present invention. The present invention yet further provides for mixing the first precursor with an oxidizing agent such as $O_2$, $CO_2$ or a combination thereof, thereby stabilizing the reactants in the reactor and improving the uniformity of the dielectric film deposited on the substrate.

In addition to the first precursor, a second precursor (gas, liquid or vapor) comprising atoms of C, H, and optionally O, F and N can be used. Optionally, a third precursor (gas, liquid or gas) comprising Ge may also be used.

Preferably, the first precursor is selected from organic molecules with ring structures comprising SiCOH components such as 1, 3, 5, 7-tetramethylcyclotetrasiloxane ("TMCTS" or "$C_4H_{16}O_4Si_4$"), octamethylcyclotetrasiloxane (OMCTS), diethoxymethylsilane (DEMS), dimethyldimethoxysilane (DMDMOS), diethylmethoxysilane (DEDMOS), and related cyclic and non-cyclic silanes, siloxanes and the like.

The second precursor that may be used is a hydrocarbon molecule. Although any hydrocarbon molecule may be used, preferably the second precursor is selected from the group consisting of hydrocarbon molecules with ring structures, preferably with more than one ring present in the molecule or with branched chains attached to the ring. Especially useful, are species containing fused rings, at least one of which contains a heteroatom, preferentially oxygen. Of these species, the most suitable are those that include a ring of a size that imparts significant ring strain, namely rings of 3 or 4 atoms and/or 7 or more atoms. Particularly attractive, are members of a class of compounds known as oxabicyclics, such as cyclopentene oxide ("CPO" or "$C_5H_8O$"). Also useful are molecules containing branched tertiary butyl (t-butyl) and isopropyl (i-propyl) groups attached to a hydrocarbon ring; the ring may be saturated or unsaturated (containing C=C double bonds). The third precursor may be formed from germane hydride or any other reactant comprising a source Ge.

The method of the present invention may further comprise the step of providing a parallel plate reactor, which has a conductive area of a substrate chuck between about 85 $cm^2$ and about 750 $cm^2$, and a gap between the substrate and a top electrode between about 1 cm and about 12 cm. A high frequency RF power is applied to one of the electrodes at a frequency between about 0.45 Mhz and about 200 Mhz. Optionally, an additional low frequency power can be applied to one of the electrodes.

The conditions used for the deposition step may vary depending on the desired final dielectric constant of the SiCOH dielectric material of the present invention. Broadly, the conditions used for providing a stable dielectric material comprising elements of Si, C, O, H that has a dielectric constant of about 2.8 or less, a tensile stress of less than 45 MPa, an elastic modulus from about 2 to about 15 GPa, and a hardness from about 0.2 to about 2 GPa include: setting the substrate temperature at between about 300° C. and about 425° C.; setting the high frequency RF power density at between about 0.1 $W/cm^2$ and about 1.5 $W/cm^2$; setting the first liquid precursor flow rate at between about 100 mg/min and about 5000 mg/min, optionally setting the second liquid precursor flow rate at between about 50 mg/min to about 10,000 mg/min; optionally setting the third liquid precursor flow rate at between about 25 mg/min to about 4000 mg/min; optionally setting the inert carrier gases such as Helium (or/and Argon) flow rate at between about 50 sccm to about 5000 sccm; setting the reactor pressure at a pressure between about 1000 mTorr and about 7000 mTorr; and setting the high frequency RF power between about 75 W and about 1000 W. Optionally, an ultra low frequency power may be added to the plasma between about 30 W and about 400 W. When the conductive area of the substrate chuck is changed by a factor of X, the RF power applied to the substrate chuck is also changed by a factor of X.

When an oxidizing agent is employed in the present invention, it is flown into the PECVD reactor at a flow rate between about 10 sccm to about 1000 sccm.

While liquid precursors are used in the above example, it is known in the art that the organosilicon gas phase precursors (such as trimethylsilane) can also be used for the deposition.

The film resulting from the above processes is called herein the "as deposited film". The conditions for providing the SiCOH dielectrics of Table 1 will be described in greater detail hereinbelow under the subheading Process Embodiments.

Subsequent to deposition, the as deposited film is optionally treated using an energy source to stabilize the film and improve its properties (electrical, mechanical, adhesive), resulting in a final optimum film. Suitable energy sources include thermal, chemical, ultraviolet (UV) light, electron beam (e-beam), microwave, and plasma. Combinations of the aforementioned energy sources can also be used in the present invention. The energy sources employed in the present invention are utilized to modify the Si—O bonding network of the as deposited SiCOH dielectric, modify other bonds in the material, cause more Si—O cross-linking, and in some cases to remove the hydrocarbon phase, with all of the aforementioned modifications resulting in a higher elastic modulus, a higher hardness, or a lower internal stress, or a combination of said properties. Either a higher modulus or a lower stress results in a lower crack propagation velocity, with the combination of higher modulus and lower stress being a preferred result of the energy treatment.

The thermal energy source includes any source such as, for example, a heating element or a lamp, that can heat the deposited dielectric material to a temperature from about 300° to about 500° C. More preferably, the thermal energy source is capable of heating the deposited dielectric material to a temperature from about 350° to about 430° C. This thermal treatment process can be carried out for various time periods, with a time period from about 1 minute to about 300 minutes being typical. The thermal treatment step is typically performed in the presence of an inert gas such as He and Ar. The thermal treatment step may be referred to as an anneal step in which rapid thermal anneal, furnace anneal, laser anneal or spike anneal conditions are employed.

The UV light treatment step is performed utilizing a source that can generate light having a wavelength from about 500 to about 150 nm, to irradiate the substrate while the wafer temperature is maintained at 25° to 500° C., with temperatures from 300°–450° C. being preferred. Radiation with >370 nm is of insufficient energy to dissociate or activate important bonds, so the wavelength range 150–370 nm is a preferred range. Using literature data and absorbance spectra measured on as deposited films, the inventors have found that <170 nm radiation may not be favored due to degradation of the SiCOH film. Further, the energy range 310–370 nm is less useful than the range 150–310 nm, due to the relatively low energy per photon from 310–370 nm. Within the 150–310 nm range, optimum overlap with the absorbance spectrum of the as deposited film and minimum degradation of the film properties (such as hydrophobicity) may be optionally used to select a most effective region of the UV spectrum for changing the SiCOH properties.

The electron beam treatment step is performed utilizing a source that is capable of generating a uniform electron flux over the wafer, with energies from 0.5 to 25 keV and current densities from 0.1 to 100 microAmp/cm$^2$ (preferably 1 to 5 microAmp/cm$^2$), while the wafer temperature is maintained at 25° to 500° C., with temperatures from 300°–450° C. being preferred. The preferred dose of electrons used in the electron beam treatment step is from 50 to 500 microcoulombs/cm$^2$, with 100 to 300 microcoulombs/cm$^2$ being preferred.

The plasma treatment step is performed utilizing a source that is capable of generating atomic hydrogen (H), and optionally CH$_3$ or other hydrocarbon radicals. Downstream plasma sources are preferred over direct plasma exposure. During plasma treatment the wafer temperature is maintained at 25° to 500° C., with temperatures from 300°–450° C. being preferred.

The plasma treatment step is performed by introducing a gas into a reactor that can generate a plasma and thereafter it is converted into a plasma. The gas that can be used for the plasma treatment includes inert gases such as Ar, N, He, Xe or Kr, with He being preferred; hydrogen or related sources of atomic hydrogen, methane, methylsilane, related sources of CH$_3$ groups, and mixtures thereof. The flow rate of the plasma treatment gas may vary depending on the reactor system being used. The chamber pressure can range anywhere from 0.05 to 20 torr, but the preferred range of pressure operation is 1 to 10 torr. The plasma treatment step occurs for a period of time, which is typically from about ½ to about 10 minutes, although longer times may be used within the invention.

An RF or microwave power source is typically used to generate the above plasma. The RF power source may operate at either the high frequency range (on the order of about 100 W or greater); the low frequency range (less than 250 W) or a combination thereof may be employed. The high frequency power density can range anywhere from 0.1 to 2.0 W/cm$^2$ but the preferred range of operation is 0.2 to 1.0 W/cm$^2$. The low frequency power density can range anywhere from 0.1 to 1.0 W/cm$^2$ but the preferred range of operation is 0.2 to 0.5 W/cm$^2$. The chosen power levels must be low enough to avoid significant sputter etching of the exposed dielectric surface (<5 nanometers removal).

According to the present invention, the fabrication of the stable SiCOH dielectric materials of the present invention may require a combination of several steps:

the material is deposited on a substrate in a 1$^{st}$ step, using deposition tool parameters in a specific range of values given here, forming the as deposited film;

the material is cured or treated using thermal, UV light, electron beam irradiation, or a combination of more than one of these, forming the final film having the desired mechanical and other properties described herein.

As is known in the art, the two process steps will be conducted within the invention in two separate process chambers that may be clustered on a single process tool, or the two chambers may be in separate process tools ("declustered"). For porous SiCOH films, the cure step may involve removal of a sacrificial hydrocarbon (porogen) component, co-deposited with the dielectric material. Suitable sacrificial hydrocarbon components that can be employed in the present invention include, but are not limited to: the second precursors that are mentioned above and said second precursors listed in the 3$^{rd}$ implementation example.

Process Embodiments

First Implementation Example, k=2.7

In a preferred process embodiment, a 300 mm substrate is placed in a PECVD tool on a heated wafer chuck at 300°–425° C. and preferably at 350° C. Any PECVD deposition reactor may be used in the present invention. Gas and liquid precursor flows are then stabilized to reach a pressure of 6 torr, although pressures from 1–10 torr may be used.

The gas composition consists of He or Ar, a SiCOH precursor, and optionally O$_2$ or CO$_2$. The SiCOH precursor contains the elements Si, C, O and H and preferred precursors include tetramethylcyclotetrasiloxane (TMCTS) or octamethylcyclotetrasiloxane (OMCTS), diethoxymethylsilane (DEMS), dimethyldimethyoxysilane (DMDMOS), diethyldimethoxysilane (DEDMOS) and related cyclic and non-cyclic silanes, siloxanes and the like. The preferred process uses octamethylcyclotetrasiloxane (OMCTS) at liquid flow of 2000–3500 mg/minute (preferably 2800±300 mg/minute) and O$_2$ at a flow of 100–200 sccm, although O$_2$ flows from 50 to 300 sccm may also be used. The preferred He flow is 500–2000 sccm.

In the preferred process, radio frequency energy is applied to both the gas introduction plate ("showerhead") at a frequency of 13.6 MHz and a power of about 350 W (although 200–450 W may be used), and also to the wafer chuck at a frequency of 13.6 MHz and a power of about 100 W (although 50–200 W may be used). As is known in the art, different RF frequencies (0.26, 0.35, 0.45 MHz) may also be used in the present invention.

Optionally, after deposition a treatment of the SiCOH film (using both thermal energy and a second energy source) is performed to stabilize the film and obtain the properties listed in Table 1. The second energy source may be radioactive (UV or electron beam) or may be chemical (using atoms of hydrogen, or other reactive gas, formed in a plasma).

Figure 1B:
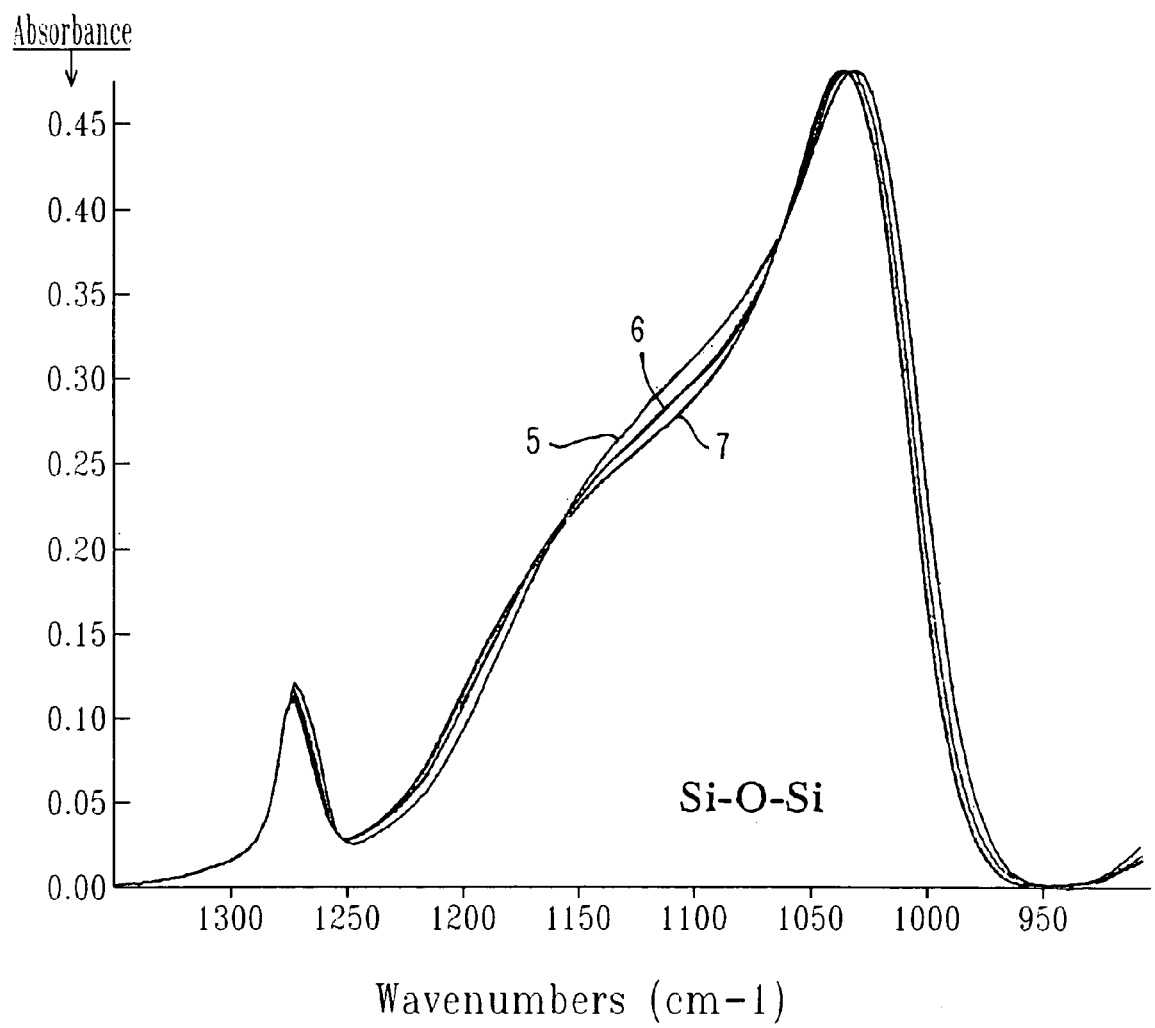

The treatment using both thermal energy and a second energy source changes the ratio of network to cage Si—O absorbance in the FTIR spectrum of the SiCOH film, and specifically decreases the ratio of cage Si—O to network Si—O absorbance. Results are shown in FIG. 1. In FIG. 1A, curve 1 is after 350° C. treatment, and curve 2 is after 410° C. treatment. In FIG. 1B, all curves are after 410° C. treatment, with curves 5, 6, and 7 showing the ratio of the cage Si—O intensity to the network Si—O intensity is decreased with increasing treatment times.

In a preferred treatment, the substrate (containing the film deposited according to the above process) is placed in a ultraviolet (UV) treatment tool, with a controlled environment (vacuum or ultra pure inert gas with $O_2$ and $H_2O$ concentration <100 parts/million "ppm", and preferably <10 ppm).

Within the invention, the UV treatment tool may be connected to the deposition tool ("clustered"), or may be a separate tool. The sample is placed in the UV treatment tool on a hot chuck at a temperature between 300° to 450° C. and preferably 350° to 400° C. A combined treatment of thermal annealing and UV radiation is applied to the sample for a period of 30 to 1,000 seconds, and preferably 100 to 600 seconds. Within the inventive UV treatment, the wavelength range from 150 nm to 370 nm may be used, although the energy range 290–370 nm is less useful than the range 150–290 nm, due to the relatively low energy per photon from 290–370 nm. Within the 150–370 nm range, optimum overlap with the absorbance spectrum of the as deposited film and minimum degradation of the film properties (such as hydrophobicity) may be optionally used to select a most effective region of the UV spectrum for changing and improving the SiCOH properties. The power is typically 1–10 kWatt, and preferably 2–5 kWatt.

In alternative embodiments, the substrate is lamp heated to the temperatures listed above. Also in alternative embodiments, the second energy source may include, but is not limited to, chemical, electron beam, microwave, or plasma energy.

The result of this treatment is a SiCOH material having the properties mentioned in the first row of Table 1 above.

Second Implementation Example, k=2.5 to 2.6

To make the SiCOH materials of the invention with k=2.5 to 2.6, a process similar to the $1^{st}$ implementation example is used, but small changes are made. Specifically, the pressure is increased above 6 torr, the SiCOH OMCTS precursor flow is decreased to about 1500–3000 mg/minute, the showerhead RF power is slightly reduced (10–20% reduction). It is important to reduce the wafer chuck RF power by about 20–50%.

Third Implementation Example, k=2.4 to 2.2

In a preferred process embodiment, a 300 mm substrate is placed in a PECVD tool on a heated wafer chuck at 100–400° C. and preferably at 200°–350° C. Tools such as the Producer made by Applied Materials and the Vector made by Novellus Systems are commonly used, although any PECVD deposition reactor may be used within the invention.

Gas and liquid precursor flows are then stabilized to reach a pressure of 1 to 6 torr, although pressures from 0.1–10 torr may be used. The gas composition consists of a SiCOH precursor, a $2^{nd}$ hydrocarbon based precursor and He or Ar.

Optionally, $O_2$ or $CO_2$ is also used. The SiCOH precursor contains the elements Si, C, O and H and preferred precursors include tetramethylcyclotetrasiloxane (TMCTS) or octamethylcyclotetrasiloxane (OMCTS), diethoxymethylsilane (DEMS), dimethyldimethoxysilane (DMDMOS), diethyldimethoxysilane (DEDMOS) and related cyclic and non-cyclic silanes, siloxanes and the like.

Processes described in U.S. Pat. Nos. 6,147,009, 6,312,793, 6,441,491, 6,437,443, 6,441,491, 6,541,398, 6,479,110 B2, and 6,497,963, the contents of which are incorporated herein by reference, may be used.

The $2^{nd}$ hydrocarbon precursor may be an organic molecule, preferably selected from the group consisting of molecules with ring structures. One class of preferred precursors are species containing fused rings, at least one of which contains a heteroatom, preferentially oxygen. Of these species, the most suitable are those that include a ring of a size that imparts significant ring strain, namely rings of 3 or 4 atoms and/or 7 or more atoms. Particularly attractive, are members of a class of compounds known as oxabicyclics, such as cyclopentene oxide ("CPO" or "$C_5H_8O$").

Preferred precursors may contain a ring and groups such as tertiary butyl and isopropyl may present in the molecule. A third class of preferred precursors contain C=C double bonds, at least 1 C=C double bond. A fourth class of highly preferred precursors contain at least 1 ring, and at least 1 C=C double bond.

The preferred process uses OMCTS, TMCTS or DEMS at liquid flow of 50–3000 mg/minute (preferably 2800±300 mg/minute) and a $2^{nd}$ hydrocarbon precursor at a flow of 10–10,000 mg/minute. The ratio of $2^{nd}$ hydrocarbon precursor to SiCOH precursor is about 1 to 100. The preferred He flow is 100–1000 sccm, and $O_2$ or $CO_2$ flows from 5 to 1000 sccm may also be used.

In the preferred process, radio frequency energy is applied to both the gas introduction plate ("showerhead") at a frequency of 13.6 MHz and a power of about 300 W (although 200–450 W may be used), and also to the wafer chuck at a frequency of 13.6 or lower MHz and a power of about 50 W (although 0–200 W may be used). The SiCOH film of the invention is deposited at a rate of 400–4,000 Angstrom/minute, and preferably about 600–1,000 Angstrom/minute. The time is adjusted to deposit a film of the desired thickness. The film contains at least a $1^{st}$ SiCOH phase and a $2^{nd}$ hydrocarbon phase.

The $2^{nd}$ hydrocarbon phase consists mainly of C and H, but may contain O or Si, and typically has a range of different molecules or molecular fragments or organic chains (rather than 1 single species). This phase may be in the form of hydrocarbon molecules or small organic chains resembling polymers, and specifically some of the species may be "dimers or trimers" containing respectively 2 or 3 molecules of the $2^{nd}$ hydrocarbon precursor described above. The molecules or chains may be covalently bonded to the SiCOH framework, or may not be bonded.

Optionally, after deposition a treatment of the SiCOH film (using both thermal energy and a second energy source) is performed to stabilize the film, remove most or all of the $2^{nd}$ hydrocarbon phase, create a $3^{rd}$ phase composed of open space having very small characteristic dimensions and improve the properties listed in Table 1. The $3^{rd}$ phase has dimensions on the order of 0.1–5 nm and preferably 1–2 nm.

The second energy source may be radioactive (UV or electron beam) or may be chemical (using atoms of hydrogen, or other reactive gas, formed in a plasma).

In a preferred treatment, the substrate (containing the film deposited according to the above process) is placed in an ultraviolet (UV) treatment tool, with a controlled environment (vacuum or ultra pure inert gas with $O_2$ and $H_2O$ concentration <100 parts/million "ppm", and preferably <10 ppm).

Within the invention, the UV treatment tool may be connected to the deposition tool ("clustered"), or may be a separate tool. The sample is placed in the UV treatment tool on a hot chuck at a temperature between 300° to 450° C. and preferably 350° to 430° C., and most preferably 370°–420° C.

A combined treatment of thermal annealing and UV radiation is applied to the sample for a period of 30 to 1,000 seconds, and preferably 100 to 600 seconds.

Any UV radiation source with emission in the wavelength region from 370 to 150 nm may be used and the wavelength range 190–370 nm is a preferred range. The range 190–290 nm is highly preferred, and within the 190–290 nm range, optimum overlap with the absorbance spectrum of the as deposited film may be optionally used to select a most effective region of the UV spectrum for changing the SiCOH properties.

The spectral region wavelength 290 to 190 or 180 nm may be selected for convenience due to the absorbance of quartz components between the light source and the substrate. The power is typically 1–10 kWatt, and preferably 2–5 kWatt.

In a preferred alternate embodiment, a combination of higher energy UV (210 to 150 nm) to activate the SiCOH framework and lower energy (300–200 nm) to activate and remove the $2^{nd}$ hydrocarbon phase may be preferred.

Optionally, the higher energy UV (210 to 150 nm) to activate the SiCOH framework may be applied in a $1^{st}$ UV step and the lower energy (300–200 nm) to activate and remove the $2^{nd}$ hydrocarbon phase may be applied in a $2^{nd}$ UV step.

In alternative embodiments, the lower energy (300–200 nm) to activate and remove the $2^{nd}$ hydrocarbon phase may be applied in a 1st UV step, and the higher energy UV (210 to 150 nm) to activate the SiCOH framework may be applied in a $2^{nd}$ UV step.

Also in alternative embodiments, the substrate is lamp heated to the temperatures listed above. Also in alternative embodiments, the second energy source may include, but is not limited to: chemical, electron beam, microwave, or plasma energy.

The treatment using both thermal energy and a second energy source changes the ratio of network to cage Si—O absorbance in the FTIR spectrum of the SiCOH film, and specifically increases the ratio of network Si—O to cage Si—O absorbance. Results are shown in FIG. 2A, in which curve 11 is the FTIR absorbance of a porous SiCOH film after a thermal (anneal) treatment, and curve 12 is the FTIR absorbance after a preferred e-beam treatment, and curve 13 is the FTIR absorbance after a preferred UV treatment. Compared to curve 11, both the e-beam treatment (12) and the UV treatment (13) show a larger ratio of the network Si—O peak to the cage Si—O peak, which correlates with a higher modulus. FTIR absorbance of the C—H stretching modes is changed by the treatment, as shown in FIG. 2A. Referring now the FIG. 2B, the elastic modulus of the same porous SiCOH film is plotted versus dose during the preferred e-beam treatment at 430° C. The modulus increases in a monotonic fashion with dose. The higher modulus is due to the higher network/cage Si—O ratio seen above in FIG. 2A.

The effect of different UV treatment times is shown in FIG. 3. The FTIR absorbance of a porous SiCOH film made within the invention is plotted in FIG. 3, wherein curve 21 is the FTIR absorbance of the as deposited film, curve 22 is the FTIR absorbance of the porous SiCOH film after a thermal (anneal) treatment for 4 hrs at 430° C., and curve 23 is the FTIR absorbance of the porous SiCOH film after 2 minutes UV treatment at 400° C., and curve 24 is the FTIR absorbance of the porous SiCOH film after 5 minutes UV treatment at 400° C. It is seen that the network to cage Si—O peak ratio increases with increasing UV treatment time.

Fourth Implementation Example, k=2.2 to 2.5

To make the SiCOH materials of the invention with k=2.2 to 2.5, a process similar to the 3rd implementation example is used, but small changes are made. Specifically, the ratio of the $2^{nd}$ hydrocarbon precursor to the $1^{st}$ SiCOH precursor is decreased to a lower value.

Fifth Implementation Example, k=2.0–2.1

To make the SiCOH materials of the invention with k=2.0 to 2.1, a process similar to the 3rd implementation example is used. The porosity of the k<2.1 materials is greater than 30%, and higher porogen/SiCOH ratio is used.

The electronic devices formed by the present invention novel method are shown in FIGS. 4–7. It should be noted that the devices shown in FIGS. 4–7 are merely illustrative examples of the present invention, while an infinite number of other devices may also be formed by the present invention novel methods.

Figure 4:
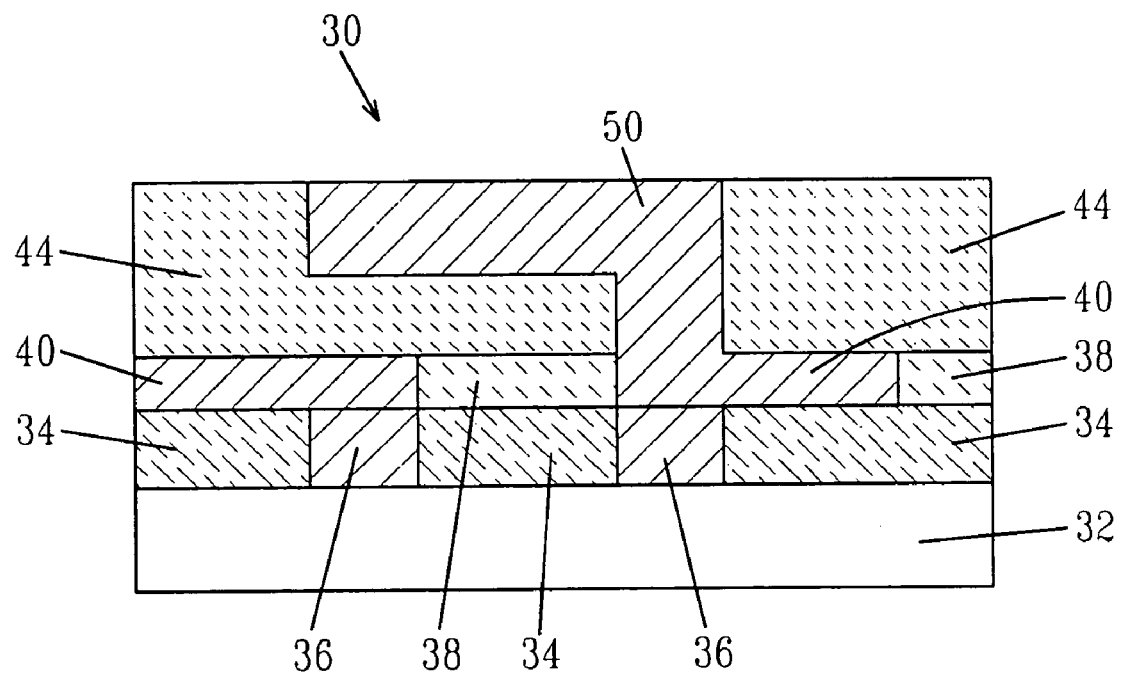
FIG. 4 is an enlarged, cross-sectional view of a present invention electronic device having an intralevel dielectric layer and an interlevel dielectric layer formed the stable low or ultra low k SiCOH dielectric material of the present invention.

In FIG. 4, an electronic device 30 built on a silicon substrate 32 is shown. On top of the silicon substrate 32, an insulating material layer 34 is first formed with a first region of metal 36 embedded therein. After a CMP process is conducted on the first region of metal 36, a SiCOH dielectric film 38 of the present invention is deposited on top of the first layer of insulating material 34 and the first region of metal 36. The first layer of insulating material 34 may be suitably formed of silicon oxide, silicon nitride, doped varieties of these materials, or any other suitable insulating materials. The SiCOH dielectric film 38 is then patterned in a photolithography process followed by etching and a conductor layer 40 is deposited thereon. After a CMP process on the first conductor layer 40 is carried out, a second layer of the inventive SiCOH film 44 is deposited by a plasma enhanced chemical vapor deposition process overlying the first SiCOH dielectric film 38 and the first conductor layer 40. The conductor layer 40 may be deposited of a metallic material or a nonmetallic conductive material. For instance, a metallic material of aluminum or copper, or a nonmetallic material of nitride or polysilicon. The first conductor 40 is in electrical communication with the first region of metal 36.

A second region of conductor 50 is then formed after a photolithographic process on the SiCOH dielectric film 44 is conducted followed by etching and then a deposition process for the second conductor material. The second region of conductor 50 may also be deposited of either a metallic material or a nonmetallic material, similar to that used in depositing the first conductor layer 40. The second region of conductor 50 is in electrical communication with the first region of conductor 40 and is embedded in the second layer of the SiCOH dielectric film 44. The second layer of the SiCOH dielectric film is in intimate contact with the first layer of SiCOH dielectric material 38. In this example, the first layer of the SiCOH dielectric film 38 is an intralevel dielectric material, while the second layer of the SiCOH dielectric film 44 is both an intralevel and an interlevel dielectric. Based on the low dielectric constant of the inventive SiCOH dielectric films, superior insulating property can be achieved by the first insulating layer 38 and the second insulating layer 44.

Figure 5:
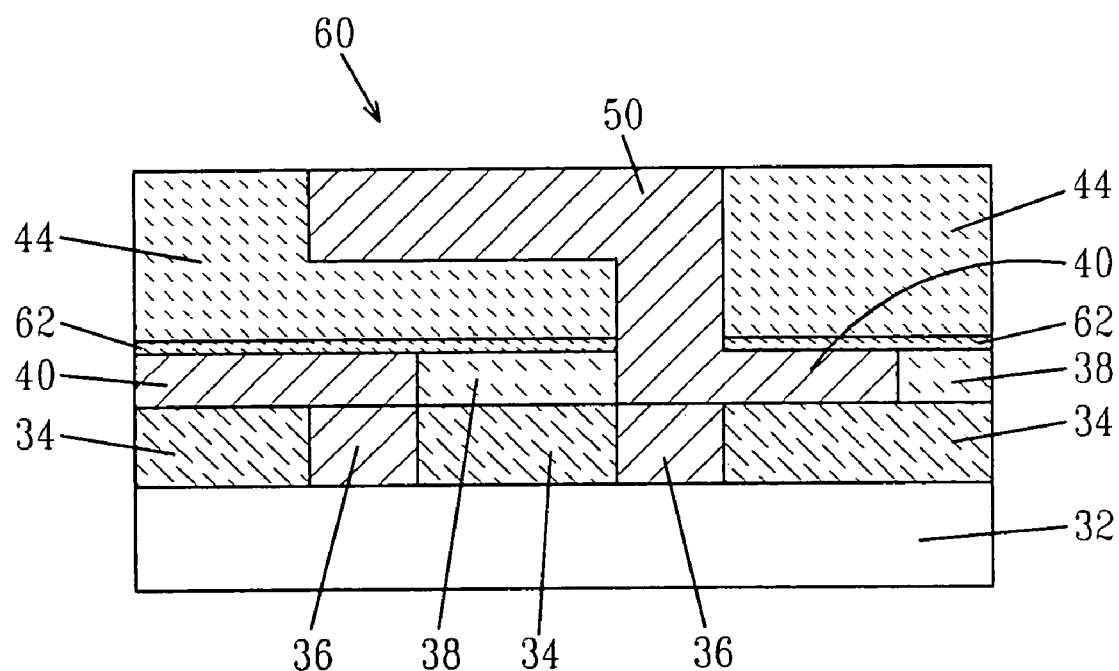
FIG. 5 is an enlarged, cross-sectional view of the present invention electronic structure of FIG. 4 having an additional diffusion barrier dielectric cap layer deposited on top of the low or ultra low k SiCOH dielectric material of the present invention.

FIG. 5 shows a present invention electronic device 60 similar to that of electronic device 30 shown in FIG. 4, but with an additional dielectric cap layer 62 deposited between the first insulating material layer 38 and the second insulating material layer 44. The dielectric cap layer 62 can be suitably formed of a material such as silicon oxide, silicon nitride, silicon oxynitride, refractory metal silicon nitride with the refractory metal being Ta, Zr, Hf or W, silicon carbide, silicon carbo-nitride (SiCN), silicon carbo-oxide (SiCO), and their hydrogenated compounds. The additional dielectric cap layer 62 functions as a diffusion barrier layer for preventing diffusion of the first conductor layer 40 into the second insulating material layer 44 or into the lower layers, especially into layers 34 and 32.

Figure 6:
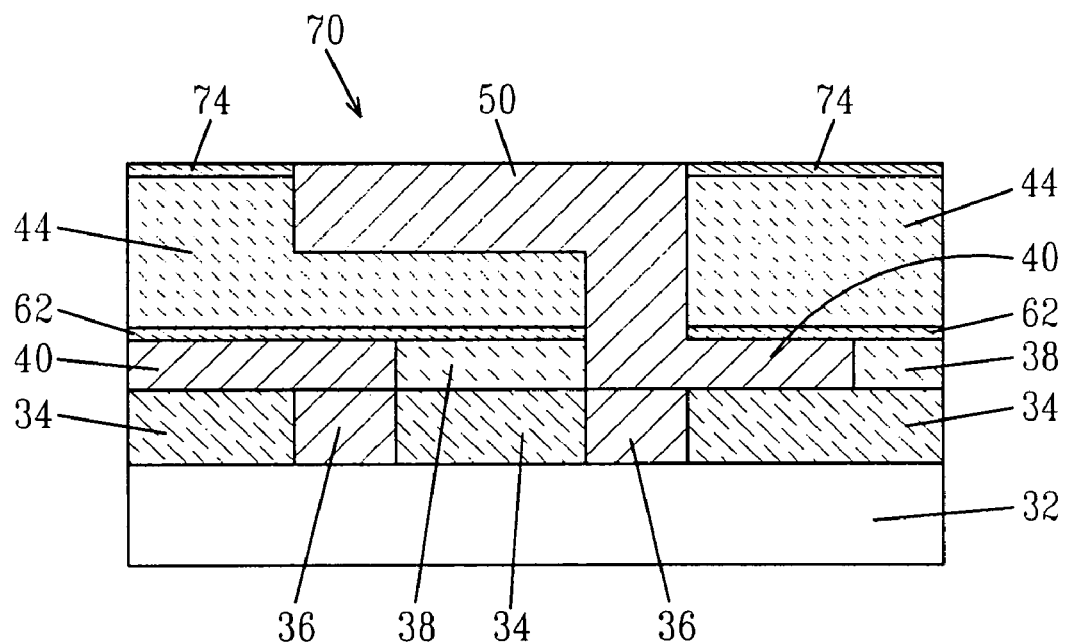
FIG. 6 is an enlarged, cross-sectional view of the present invention electronic structure of FIG. 5 having an additional RIE hard mask/polish-stop dielectric cap layer and a dielectric cap diffusion barrier layer deposited on top of the polish-stop layer.

Another alternate embodiment of the present invention electronic device 70 is shown in FIG. 6. In the electronic device 70, two additional dielectric cap layers 72 and 74 which act as a RIE mask and CMP (chemical mechanical polishing) polish stop layer are used. The first dielectric cap layer 72 is deposited on top of the first ultra low k insulating material layer 38 and used as a RIE mask and CMP stop, so the first conductor layer 40 and layer 72 are approximately co-planar after CMP. The function of the second dielectric layer 74 is similar to layer 72, however layer 74 is utilized in planarizing the second conductor layer 50. The polish stop layer 74 can be deposited of a suitable dielectric material such as silicon oxide, silicon nitride, silicon oxynitride, refractory metal silicon nitride with the refractory metal being Ta, Zr, Hf or W, silicon carbide, silicon carbo-oxide (SiCO), and their hydrogenated compounds. A preferred polish stop layer composition is SiCH or SiCOH for layers 72 or 74. A second dielectric layer 74 can be added on top of the second SiCOH dielectric film 44 for the same purposes.

Figure 7:
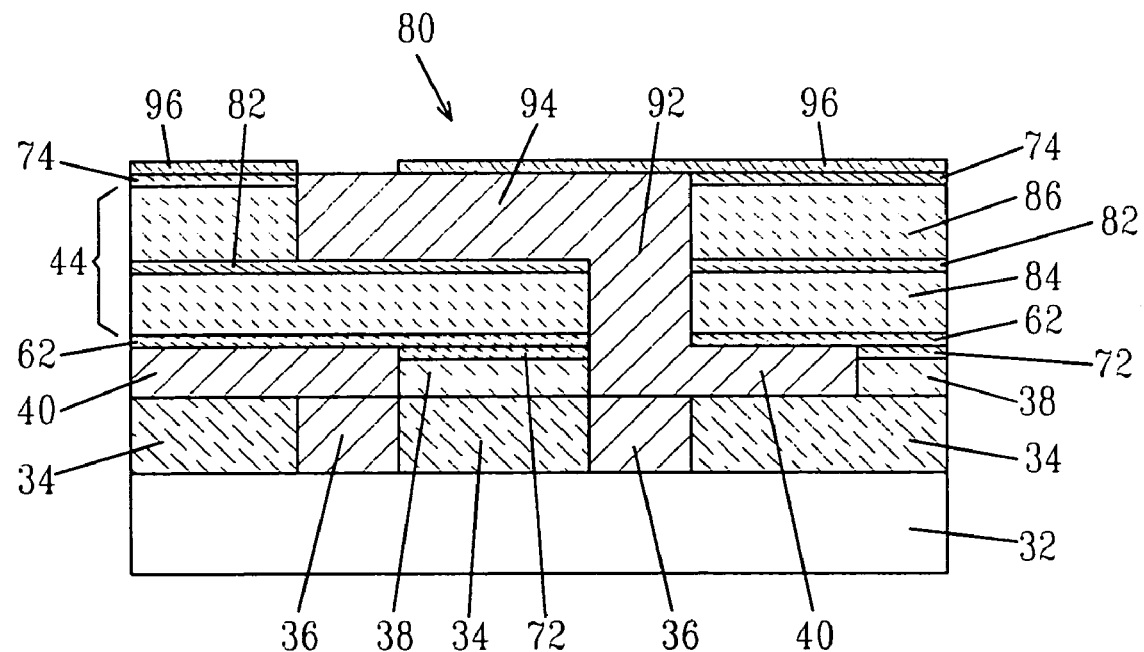
FIG. 7 is an enlarged, cross-sectional view of the present invention electronic structure of FIG. 6 having additional RIE hard mask/polish-stop dielectric layers deposited on top of the stable low or ultra low k SiCOH dielectric material of the present invention.

Still another alternate embodiment of the present invention electronic device 80 is shown in FIG. 7. In this alternate embodiment, an additional layer 82 of dielectric material is deposited and thus dividing the second insulating material layer 44 into two separate layers 84 and 86. The intralevel and interlevel dielectric layer 44 formed of the inventive ultra low k material, shown in FIG. 4, is therefore divided into an interlayer dielectric layer 84 and an intralevel dielectric layer 86 at the boundary between via 92 and interconnect 94. An additional diffusion barrier layer 96 is further deposited on top of the upper dielectric layer 74. The additional benefit provided by this alternate embodiment electronic structure 80 is that dielectric layer 82 acts as an RIE etch stop providing superior interconnect depth control. Thus, the composition of layer 82 is selected to provide etch selectivity with respect to layer 86.

Still other alternate embodiments may include an electronic structure which has layers of insulating material as intralevel or interlevel dielectrics in a wiring structure that includes a pre-processed semiconducting substrate which has a first region of metal embedded in a first layer of insulating material, a first region of conductor embedded in a second layer of the insulating material wherein the second layer of insulating material is in intimate contact with the first layer of insulating material, and the first region of conductor is in electrical communication with the first region of metal, a second region of conductor in electrical communication with the first region of conductor and is embedded in a third layer of insulating material, wherein the third layer of insulating material is in intimate contact with the second layer of insulating material, a first dielectric cap layer between the second layer of insulating material and the third layer of insulating material and a second dielectric cap layer on top of the third layer of insulating material, wherein the first and the second dielectric cap layers are formed of a material that includes atoms of Si, C, O and H, or preferably a SiCOH dielectric film of the present invention.

Still other alternate embodiments of the present invention include an electronic structure which has layers of insulating material as intralevel or interlevel dielectrics in a wiring structure that includes a pre-processed semiconducting substrate that has a first region of metal embedded in a first layer of insulating material, a first region of conductor embedded in a second layer of insulating material which is in intimate contact with the first layer of insulating material, the first region of conductor is in electrical communication with the first region of metal, a second region of conductor that is in electrical communication with the first region of conductor and is embedded in a third layer of insulating material, the third layer of insulating material is in intimate contact with the second layer of insulating material, and a diffusion barrier layer formed of the multiphase, ultra low k film of the present invention deposited on at least one of the second and third layers of insulating material.

Still other alternate embodiments include an electronic structure which has layers of insulating material as intralevel or interlevel dielectrics in a wiring structure that includes a pre-processed semiconducting substrate that has a first region of metal embedded in a first layer of insulating material, a first region of conductor embedded in a second layer of insulating material which is in intimate contact with the first layer of insulating material, the first region of conductor is in electrical communication with the first region of metal, a second region of conductor in electrical communication with the first region of conductor and is embedded in a third layer of insulating material, the third layer of insulating material is in intimate contact with the second layer of insulating material, a reactive ion etching (RIE) hard mask/polish stop layer on top of the second layer of insulating material, and a diffusion barrier layer on top of the RIE hard mask/polish stop layer, wherein the RIE hard mask/polish stop layer and the diffusion barrier layer are formed of the SiCOH dielectric film of the present invention.

Still other alternate embodiments include an electronic structure which has layers of insulating materials as intralevel or interlevel dielectrics in a wiring structure that includes a pre-processed semiconducting substrate that has a first region of metal embedded in a first layer of insulating material, a first region of conductor embedded in a second layer of insulating material which is in intimate contact with the first layer of insulating material, the first region of conductor is in electrical communication with the first region of metal, a second region of conductor in electrical communication with the first region of conductor and is embedded in a third layer of insulating material, the third layer of insulating material is in intimate contact with the second layer of insulating material, a first RIE hard mask, polish stop layer on top of the second layer of insulating material, a first diffusion barrier layer on top of the first RIE hard mask/polish stop layer, a second RIE hard mask/polish stop layer on top of the third layer of insulating material, and a second diffusion barrier layer on top of the second RIE hard mask/polish stop layer, wherein the RIE hard mask/polish stop layers and the diffusion barrier layers are formed of the SiCOH dielectric film of the present invention.

Still other alternate embodiments of the present invention includes an electronic structure that has layers of insulating material as intralevel or interlevel dielectrics in a wiring structure similar to that described immediately above but further includes a dielectric cap layer which is formed of the SiCOH dielectric material of the present invention situated between an interlevel dielectric layer and an intralevel dielectric layer.

While the present invention has been described in an illustrative manner, it should be understood that the terminology used is intended to be in a nature of words of description rather than of limitation. Furthermore, while the present invention has been described in terms of a preferred and several alternate embodiments, it is to be appreciated that those skilled in the art will readily apply these teachings to other possible variations of the inventions.

What we claim is:

1. A dielectric material comprising elements of Si, C, O, H having a dielectric constant of about 2.8 or less, a tensile stress of less than 45 MPa, an elastic modulus from about 2 to about 15 GPa, and a hardness from about 0.2 to about 2 GPa, said dielectric material has a covalently bonded tri-dimensional network structure.

2. The dielectric material of claim 1 wherein said material has a cohesive strength from about 1.7 to about 4.5 $J/m^2$.

3. The dielectric material of claim 1 wherein said material has a crack development velocity in water of not more than $1 \times 10^{-10}$ m/sec for a film thickness from about 1.1 to about 2.8 microns.

4. The dielectric material of claim 1 wherein the dielectric constant is 2.7, the tensile stress is less than 45 MPa, the elastic modulus is from about 9 to about 15 GPa, and the hardness is from about 0.5 to about 2 GPa.

5. The dielectric material of claim 4 wherein said material has a cohesive strength from about 4.0 to about 4.5 $J/m^2$.

6. The dielectric material of claim 4 wherein said material has a crack development velocity in water of not more than $1 \times 10^{-10}$ m/sec for a film thickness of 2.8 microns.

7. The dielectric material of claim 1 wherein the dielectric constant is 2.6, the tensile stress is less than 45 MPa, the elastic modulus is from about 8 to about 13 GPa, and the hardness is from about 0.4 to about 1.9 GPa.

8. The dielectric material of claim 7 wherein the material has a cohesive strength from about 4.0 to about 4.5 $J/m^2$.

9. The dielectric material of claim 7 wherein the material has a crack development velocity in water of not more than $1 \times 10^{-10}$ m/sec for a film thickness of 2.7 microns.

10. The dielectric material of claim 1 wherein the dielectric constant is 2.5, the tensile stress is less than 45 MPa, the elastic modulus is from about 7 to about 12 GPa, and the hardness is from about 0.35 to about 1.8 GPa.

11. The dielectric material of claim 10 wherein the material has a cohesive strength from about 2.5 to about 3.9 $J/m^2$.

12. The dielectric material of claim 10 wherein the material has a crack development velocity in water of not more than $1 \times 10^{-10}$ m/sec for a film thickness of 2.5 microns.

13. The dielectric material of claim 1 wherein the dielectric constant is 2.4, the tensile stress is less than 40 MPa, the elastic modulus is from about 6 to about 11 GPa, and the hardness is from about 0.3 to about 1.7 GPa.

14. The dielectric material of claim 13 wherein the material has a cohesive strength from about 2.4 to about 3.8 $J/m^2$.

15. The dielectric material of claim 13 wherein said material has a crack development velocity in water of not more than $1 \times 10^{-10}$ m/sec for a film thickness of 2.3 microns.

16. The dielectric material of claim 1 wherein the dielectric constant is 2.3, the tensile stress is less than 40 MPa, the elastic modulus is from about 5 to about 10 GPa, and the hardness is from about 0.25 to about 1.6 GPa.

17. The dielectric material of claim 16 wherein material has a cohesive strength from about 2.2 to about 3.7 $J/m^2$.

18. The dielectric material of claim 16 wherein said material has a crack development velocity in water of not more than $1 \times 10^{-10}$ m/sec for a film thickness of 1.9 microns.

19. The dielectric material of claim 1 wherein the dielectric constant is 2.2, the tensile stress is less than 40 MPa, the elastic modulus is from about 4 to about 9 GPa, and the hardness is from about 0.2 to about 1.5 GPa.

20. The dielectric material of claim 19 wherein the material has a cohesive strength from about 2.0 to about 3.5 $J/m^2$.

21. The dielectric material of claim 19 wherein the material has a crack development velocity in water of not more than $1 \times 10^{-10}$ m/sec for a film thickness of 1.5 microns.

22. The dielectric material of claim 1 wherein the dielectric constant is 2.1, the tensile stress is from about 20 to about 35 MPa, the elastic modulus is from about 3 to about 8 GPa, and the hardness is from about 0.2 to about 1.4 GPa.

23. The dielectric material of claim 22 wherein the material has a cohesive strength from about 1.8 to about 3.4 $J/m^2$.

24. The dielectric material of claim 22 wherein the material has a crack development velocity in water of not more than $1 \times 10^{-10}$ m/sec for a film thickness of 1.3 microns.

25. The dielectric material of claim 1 wherein the dielectric constant is 2.0, the tensile stress is from about 20 to about 35 MPa, the elastic modulus is from about 2 to about 7 GPa, and the hardness is 0.2 GPa.

26. The dielectric material of claim 25 wherein the material has a cohesive strength is from about 1.7 to about 3.3 $J/m^2$.

27. The dielectric material of claim 25 wherein the material has a crack development velocity in water of not more than $1 \times 10^{-10}$ m/sec for a film thickness of 1.1 microns.

28. The dielectric material of claim 1 wherein said covalently bonded tri-dimensional network structure further comprises Si—O bonds that produce an FTIR absorbance spectrum in which the ratio of the cage Si—O intensity to the network Si—O intensity is decreased using a treatment after deposition.

29. The dielectric material of claim 28 wherein said treatment uses at least an energy source selected from the group consisting of thermal, chemical, ultraviolet (UV) light, electron beam (e-beam), microwave and plasma.

30. The dielectric material of claim 1 wherein said material has a water contact angle that is greater than 70°.

31. The dielectric material of claim 1 wherein said dielectric material further comprises a multiplicity of nanometer-sized pores.

32. An interconnect structure comprising at least a dielectric material comprising elements of Si, C, O, H having a dielectric constant of about 2.8 or less, a tensile stress of less than 45 MPa, an elastic modulus from about 2 to about 15 GPa, and a hardness from about 0.2 to about 2 GPa and wiring regions, said dielectric material has a covalently bonded tri-dimensional network structure.

33. The electronic structure of claim 32 wherein the dielectric constant of the dielectric material is 2.7, the elastic modulus of the dielectric material is from about 9 to about 15 GPa, and the hardness of the dielectric material is from about 0.5 to about 2 GPa.

34. The electronic structure of claim 32 wherein the dielectric constant of the dielectric material is 2.6, the elastic modulus of the dielectric material is from about 8 to about 13 GPa, and the hardness of the dielectric material is from about 0.4 to about 1.9 GPa.

35. The electronic structure of claim 32 wherein the dielectric constant of the dielectric material is 2.5, the elastic modulus of the dielectric material is from about 7 to about 12 GPa, and the hardness of the dielectric material is from about 0.35 to about 1.8 GPa.

36. The electronic structure of claim 32 wherein the dielectric constant of the dielectric material is 2.4, the elastic modulus of the dielectric material is from about 6 to about 11 GPa, and the hardness of the dielectric material is from about 0.3 to about 1.7 GPa.

37. The electronic structure of claim 32 wherein the dielectric constant of the dielectric material is 2.3, the elastic modulus of the dielectric material is from about 5 to about 10 GPa, and the hardness of the dielectric material is from about 0.25 to about 1.6 GPa.

38. The electronic structure of claim 32 wherein the dielectric constant of the dielectric material is 2.2, the elastic modulus of the dielectric material is from about 4 to about 9 GPa, and the hardness of the dielectric material is from about 0.2 to about 1.5 GPa.

39. The electronic structure of claim 32 wherein the dielectric constant of the dielectric material is 2.1, the elastic modulus of the dielectric material is from about 3 to about 8 GPa, and the hardness of the dielectric material is from about 0.2 to about 1.4 GPa.

40. The electronic structure of claim 32 wherein the dielectric constant of the dielectric material is 2.0, the tensile stress of the dielectric material is from about 20 to about 35 MPa, the elastic modulus of the dielectric material is from about 2 to about 7 GPa, and the hardness of the dielectric material is 0.2 GPa.

41. The electronic structure of claim 32 wherein said dielectric material further comprises Si—O bonds that produce an FTIR absorbance spectrum in which the ratio of the cage Si—O intensity to the network Si—O intensity is decreased using a treatment after deposition.

42. The electronic structure of claim 41 wherein said treatment uses at least an energy source selected from the group consisting of thermal, chemical, ultraviolet (UV) light, electron beam (e-beam), microwave and plasma.

43. The electronic structure of claim 32 wherein the dielectric material has a water contact angle of greater than 70°.

44. The electronic structure of claim 32 wherein said dielectric material further comprises a multiplicity of nanometer-sized pores.

45. A dielectric material comprising elements of Si, C, O, H having a dielectric constant of about 2.8 or less, a tensile stress of less than 45 MPa, an elastic modulus from about 2 to about 15 GPa, a hardness from about 0.2 to about 2 GPa, a cohesive strength from about 1.7 to about 4.5 $J/m^2$, and a crack development velocity in water of not more than $1\times10^{-10}$ m/sec for a film thickness from about 1.1 to about 2.8 microns.

* * * * *

UNITED STATES PATENT AND TRADEMARK OFFICE
CERTIFICATE OF CORRECTION

PATENT NO.         : 7,030,468 B2                                    Page 1 of 1
APPLICATION NO. : 10/758724
DATED              : April 18, 2006
INVENTOR(S)        : Stephen M. Gates et al.

It is certified that error appears in the above-identified patent and that said Letters Patent is hereby corrected as shown below:

Title Page of Patent: item 74 - Insert
-- Scully, Scott, Murphy & Presser, P.C.
   Robert M. Trepp, Esq. --

Column 7, Line 9:
"45 Mpa or a" should read -- 45 MPa or a --

Column 18, Line 54-55:
"hard mask, polish stop" should read -- hard mask/polish stop --

Column 20, Line 31:
"about 1 7 to about" should read -- about 1.7 to about --

Signed and Sealed this

Twenty-seventh Day of May, 2008

JON W. DUDAS
*Director of the United States Patent and Trademark Office*